(12) United States Patent
Endo et al.

(10) Patent No.: US 7,541,132 B2
(45) Date of Patent: Jun. 2, 2009

(54) CHEMICALLY AMPLIFIED RESIST MATERIAL, TOPCOAT FILM MATERIAL AND PATTERN FORMATION METHOD USING THE SAME

(75) Inventors: Masayuki Endo, Osaka (JP); Masaru Sasago, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/968,826

(22) Filed: Jan. 3, 2008

(65) Prior Publication Data

US 2008/0286687 A1 Nov. 20, 2008

(30) Foreign Application Priority Data

May 16, 2007 (JP) .............................. 2007-130425

(51) Int. Cl.
*G03F 7/004* (2006.01)
*G03F 7/30* (2006.01)
(52) U.S. Cl. .............. 430/270.1; 430/271.1; 430/273.1; 430/326; 430/330
(58) Field of Classification Search .............. 430/270.1, 430/271.1, 273.1, 326, 330
See application file for complete search history.

(56) References Cited

U.S. PATENT DOCUMENTS

| 5,650,261 | A | * | 7/1997 | Winkle | 430/270.1 |
| 5,691,100 | A | * | 11/1997 | Kudo et al. | 430/170 |
| 6,746,828 | B2 | * | 6/2004 | Richter et al. | 430/322 |
| 2006/0263702 | A1 | * | 11/2006 | Yamashita et al. | 430/5 |
| 2007/0243487 | A1 | * | 10/2007 | Anze et al. | 430/270.1 |

OTHER PUBLICATIONS

Yoon et al. "Influence of Resin Properties to Resist Performance at ArF Lithography", Proceedings of SPIE, vol. 5376, pp. 583-590, 2004.

* cited by examiner

*Primary Examiner*—John S Chu
(74) *Attorney, Agent, or Firm*—McDermott Will & Emery LLP

(57) ABSTRACT

A resist film made of a chemically amplified resist material including a polymer; a photo-acid generator and carbamoyl oxime is formed on a substrate. Subsequently, pattern exposure is performed by selectively irradiating the resist film with exposing light. After the pattern exposure, the resist film is baked, and the baked resist film is developed, so as to form a resist pattern made of the resist film.

18 Claims, 8 Drawing Sheets

CHEMICALLY AMPLIFIED RESIST MATERIAL, TOPCOAT FILM MATERIAL AND PATTERN FORMATION METHOD USING THE SAME

CROSS-REFERENCE TO RELATED APPLICATIONS

This application claims priority under 35 U.S.C. §119 on Patent Application No. 2007-130425 filed in Japan on May 16, 2007, the entire contents of which are hereby incorporated by reference.

BACKGROUND OF THE INVENTION

The present invention relates to a chemically amplified resist material for use in fabrication process or the like for semiconductor devices, a topcoat film material for use in forming a topcoat film on a resist film and a pattern formation method using them.

In accordance with the increased degree of integration of semiconductor integrated circuits and downsizing of semiconductor devices, there are increasing demands for further rapid development of lithography technique. Currently, pattern formation is carried out through photolithography using exposing light of a mercury lamp, KrF excimer laser, ArF excimer laser or the like. Moreover, attempts are recently being made to apply immersion lithography to an ArF light source. Under these circumstances, it is regarded significant to elongate the lifetime of ArF excimer laser lithography beyond a 65-nm node generation, and resist materials to be used for this purpose are now under development.

With respect to a resist material for an ArF light source, it is reported that the resolution of a pattern to be formed is improved by changing the composition of a polymer included in the resist material as a principal component (see, for example, S. W. Yoon et al., "Influence of resin properties to resist performance at ArF lithography", Proc. SPIE, vol. 5376, p. 583 (2004)).

Now, a conventional pattern formation method using a chemically amplified resist material will be described with reference to FIGS. 9A through 9D.

First, a positive chemically amplified resist material having the following composition is prepared:

| | |
|---|---|
| Base polymer: poly((2-methyl-2-adamantyl methacrylate) (50 mol %) - (γ-butyrolactone methacrylate) (40 mol %) - (2-hydroxyadamantyl methacrylate) (10 mol %)) | 2 g |
| Photo-acid generator: triphenylsulfonium nonafluorobutane sulfonate | 0.06 g |
| Quencher: triethanolamine | 0.001 g |
| Solvent: propylene glycol monomethyl ether acetate | 20 g |

Next, as shown in FIG. 9A, the aforementioned chemically amplified resist material is applied on a substrate 1 and the resultant substrate is annealed with a hot plate at a temperature of 90° C. for 60 seconds, so as to form a resist film 2 with a thickness of 0.35 µm.

Then, as shown in FIG. 9B, pattern exposure is carried out by irradiating the resist film 2 with exposing light 4 of ArF excimer laser having NA (numerical aperture) of 0.85 through a mask 3.

After the pattern exposure, as shown in FIG. 9C, the resist film 2 is baked with a hot plate at a temperature of 110° C. for 60 seconds.

Thereafter, the resultant resist film 2 is developed with a 2.38 wt % tetramethylammonium hydroxide aqueous solution (alkaline developer). In this manner, a resist pattern 2a made of an unexposed portion of the resist film 2 and having a line width of 0.065 µm is formed as shown in FIG. 9D.

As shown in FIG. 9D, however, the resolution and the shape of the pattern cannot be improved at all by the conventional method in which the composition of the polymer is merely changed.

When the resist pattern 2a in such a defective shape is used for etching a target film, the resultant pattern of the target film is also in a defective shape, which disadvantageously lowers the productivity and the yield in the fabrication process for semiconductor devices.

SUMMARY OF THE INVENTION

In consideration of the aforementioned conventional problem, an object of the invention is improving the resolution of a pattern formed by using a chemically amplified resist material.

The present inventors have variously examined the reason for the low resolution of the conventional chemically amplified resist material, resulting in finding that an acid generated from the photo-acid generator is so largely diffused during the post exposure bake (PEB) that the contrast of the pattern is degraded. The present inventors have further studied this finding and have found that when carbamoyl oxime is included in the chemically amplified resist, a base generated from the carbamoyl oxide suppresses excessive diffusion of the acid during the post exposure bake so as to improve the contrast.

The principle of the present invention will now be described with reference to FIG. 1. FIG. 1 shows an acid 53 generated from a photo-acid generator and a base 54 generated from carbamoyl oxime, during the post exposure bake, in a resist film 52 made of a chemically amplified resist material of this invention and formed on a substrate 51. In an exposed portion 52a of the resist film 52, the acid 53 generated with exposing light is to be diffused mainly to an unexposed portion 52b during the post exposure bake. At this point, this diffusion of the acid is suppressed by the base 54 generated in the unexposed portion 52b during the post exposure bake. Since an unwanted reaction of the chemically amplified resist material otherwise caused by the acid 53 can be thus suppressed, the contrast of the pattern can be improved.

Furthermore, when a topcoat film material used for forming a topcoat film on a resist film for protecting the resist film includes carbamoyl oxime, the diffusion of the acid particularly in a surface portion of the resist film can be suppressed. Since a large amount of acid is generated with the exposing light in the surface portion of the resist film, the excessive diffusion of the acid, which may degrade the contrast, can be thus prevented. This will now be described with reference to FIG. 2. FIG. 2 shows an acid 53 generated from a photo-acid generator during the post exposure bake in a resist film 52 formed on a substrate 51 and a base 54 generated from carbamoyl oxime included in a topcoat film 55 of this invention. In an exposed portion 52a of the resist film 52, the acid 53 generated with the exposing light is to be diffused mainly to an unexposed portion 52b of the resist film 52 through the post exposure bake, but the base 54 generated through the post exposure bake in the topcoat film 55 suppresses the diffusion of the acid. Thus, an unwanted reaction of the chemically amplified resist material particularly in a pattern upper portion of the resist film 52 otherwise caused by the acid 53 can be suppressed, and therefore, the contrast of the pattern can be improved and roughness of the pattern can be reduced.

It is noted that carbamoyl oxime may be included not only in a topcoat film material but also in a resist material in this invention. Thus, the excessive diffusion of the acid can be more efficiently suppressed owing to the effect of the base generated in the resist film and the topcoat film.

Semiconductor fabrication process using the chemically amplified resist material or the topcoat film material of this invention exhibits its effect in general dry exposure or immersion exposure. In the immersion exposure using a topcoat film, the topcoat film prevents direct contact between an immersion liquid and a resist film, so as to make it difficult for the immersion liquid to permeate into the resist film.

A base included as a quencher in a general chemically amplified resist material is a base originally included in the resist material and cannot sufficiently suppress the diffusion of the acid during the post exposure bake. This is because the base is originally included in the resist material and hence it merely reduces the amount of acid generated in an exposed portion as a whole and deactivates the acid generated in the exposed portion before it is diffused.

The carbamoyl oxime of this invention generates, as shown in Chemical Formula 1 below, isocyanate and oxime by heating, and the isocyanate and the oxime respectively generate amines, that is, bases, with moisture included in the air as shown in Chemical Formulas 2 and 3 below.

General carbamate (urethane) is easily decomposed with an acid or the like without being heated so as to generate isocyanate and alcohol. The generated isocyanate is hydrolyzed into amine, and this deactivates the acid generated in the exposure, which inhibits normal pattern formation. On the contrary, since the carbamoyl oxime of this invention is decomposed neither with an acid nor with light, there is no fear of such inhibition. Furthermore, since one molecule of the carbamoyl oxime generates two amines (bases), the diffusion of the acid generated from the photo-acid generator can be more efficiently suppressed.

Chemical Formula 1:

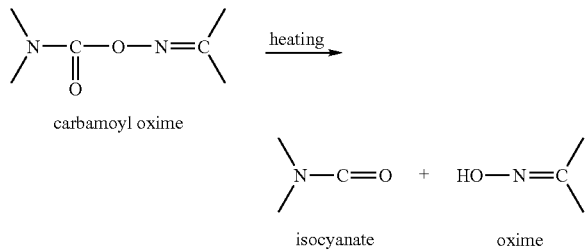

carbamoyl oxime isocyanate    oxime

Chemical Formula 2:

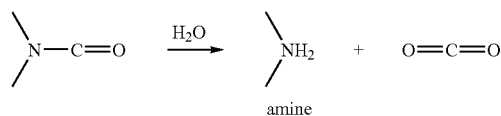

amine

Chemical Formula 3:

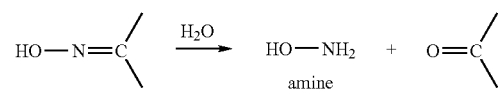

amine

Specifically, the chemically amplified resist material of this invention includes a polymer, a photo-acid generator and carbamoyl oxime.

In the chemically amplified resist material of this invention, the photo-acid generator can be triphenylsulfonium nonafluorobutane sulfonate, triphenylsulfonium trifluoromethane sulfonate, diphenyliodonium nonafluorobutane sulfonate or diphenyliodonium trifluoromethane sulfonate.

The topcoat film material of this invention is used for forming a topcoat film on a resist film made of a chemically amplified resist material and includes carbamoyl oxime; and an alkali-soluble polymer.

In the topcoat film material of this invention, the alkali-soluble polymer can be polyacrylic acid, polymethacrylic acid, polynorbornene methyl carboxylic acid, polynorbornene carboxylic acid, polynorbornene methyl hexafluoroisopropyl alcohol, polynorbornene hexafluoroisopropyl alcohol or polyvinyl alcohol.

In the chemically amplified resist material or the topcoat film material of this invention, the carbamoyl oxime can be 2-butanone-2-(methacryloyloxy)-ethyl carbamoyl oxime, 2-butanone-2-(methacryloyloxy)-methyl carbamoyl oxime, 2-butanone-2-(acryloyloxy)-ethyl carbamoyl oxime, 2-butanone-2-(acryloyloxy)-methyl carbamoyl oxime, 2-butanone-n-butyl carbamoyl oxime, 2-butanone-isobutyl carbamoyl oxime, 2-butanone-n-propyl carbamoyl oxime, 2-butanone-isopropyl carbamoyl oxime, 2-butanone-ethyl carbamoyl oxime, 2-butanone-methyl carbamoyl oxime, 2-propanone-2-(methacryloyloxy)-ethyl carbamoyl oxime, 2-propanone-2-(methacryloyloxy)-methyl carbamoyl oxime, 2-propanone-2-(acryloyloxy)-ethyl carbamoyl oxime, 2-propanone-2-(acryloyloxy)-methyl carbamoyl oxime, 2-propanone-n-butyl carbamoyl oxime, 2-propanone-isobutyl carbamoyl oxime, 2-propanone-n-propyl carbamoyl oxime, 2-propanone-isopropyl carbamoyl oxime, 2-propanone-ethyl carbamoyl oxime or 2-propanone-methyl carbamoyl oxime.

According to the present invention, the content of the carbamoyl oxime in the resist material is preferably several wt % based on a polymer included in the resist material. Although the carbamoyl oxime included in the resist material suppresses excessive diffusion of an acid generated during post exposure bake, an excessive amount of base excessively deactivates the acid. Therefore, an appropriate amount of base should be generated. Accordingly, the content is preferably 0.1 wt % through 5 wt %.

The temperature at which a base is generated from the carbamoyl oxime through the post exposure bake depends upon a substituent of the carbamoyl oxime and is generally approximately not less than 110° C. and not more than 130° C. This temperature is higher than a pre-bake temperature for a chemically amplified resist material and a bake temperature for a topcoat film. Therefore, the base is minimally generated during the pre-bake of the resist material or during the bake of the topcoat film. Even if a small amount of base is generated during the pre-bake of the resist material or during the bake of the topcoat film, such a base does not cause a serious problem because it merely slightly neutralizes an acid generated through exposure.

Furthermore, the carbamoyl oxime can be synthesized through dehydration condensation of isocyanate and oxime in the presence of an acid.

The first pattern formation method of this invention includes the steps of forming, on a substrate, a resist film made of a chemically amplified resist material including a polymer, a photo-acid generator and carbamoyl oxime; performing pattern exposure by selectively irradiating the resist film with exposing light; baking the resist film after the pattern exposure; and forming a resist pattern made of the resist film by developing the resist film after baking.

In the first pattern formation method, since the chemically amplified resist material includes the carbamoyl oxime, an acid generated in an exposed portion of the resist film and diffusing into an unexposed portion during post exposure bake can be deactivated by amine produced through decomposition of the carbamoyl oxime. Therefore, contrast of the resist pattern is improved, and hence, the resist pattern can be formed in a good shape.

In the first pattern formation method, the pattern exposure may be performed with a liquid provided on the resist film (namely, immersion exposure may be employed).

The second pattern formation method of this invention includes the steps of forming a resist film made of a chemically amplified resist material on a substrate; forming, on the resist film, a topcoat film including carbamoyl oxime and an alkali-soluble polymer; performing pattern exposure by selectively irradiating the resist film with exposing light through the topcoat film; baking the resist film and the topcoat film after the pattern exposure; and forming a resist pattern made of the resist film by developing the resist film after baking.

In the second pattern formation method, since the topcoat film formed on the resist film includes the carbamoyl oxime, an acid generated in an exposed portion of the resist film and diffusing into an unexposed portion during post exposure bake can be deactivated by amine produced through decomposition of the carbamoyl oxime included in the topcoat film. Therefore, contrast of the resist pattern is improved, and hence, the resist pattern can be formed in a good shape.

In the second pattern formation method, the pattern exposure may be performed with a liquid provided on the resist film (namely, immersion exposure may be employed).

In the second pattern formation method, the chemically amplified resist material preferably includes carbamoyl oxime.

In the first or second pattern formation method, the liquid can be water or an acidic solution.

In this case, the acidic solution is a cesium sulfate ($Cs_2SO_4$) aqueous solution or a phosphoric acid ($H_3PO_4$) aqueous solution.

In the first or second pattern formation method, the exposing light can be ArF excimer laser.

In the first or second pattern formation method, the exposing light can be KrF excimer laser, $Xe_2$ laser, $F_2$ laser, KrAr laser or $Ar_2$ laser.

In the first or second pattern formation method, the exposing light can be extreme UV (EUV) or electron beams (EB) when dry exposure is employed.

As described so far, according to the chemically amplified resist material, the topcoat film material and the pattern formation method using them of this invention, excessive diffusion of an acid generated from a photo-acid generator can be suppressed, so that a resist pattern can be formed with high resolution in a good shape.

DETAILED DESCRIPTION OF THE INVENTION

EMBODIMENT 1

A pattern formation method using a chemically amplified resist material according to Embodiment 1 of the invention will now be described with reference to FIGS. 3A through 3D.

First, a positive chemically amplified resist material having the following composition is prepared:

| | |
|---|---|
| Base polymer: poly((2-methyl-2-adamantyl methacrylate) (50 mol %) - (γ-butyrolactone methacrylate) (40 mol %) - (2-hydroxyadamantyl methacrylate) (10 mol %)) | 2 g |
| Photo-acid generator: triphenylsulfonium nonafluorobutane sulfonate | 0.06 g |
| Quencher: triethanolamine | 0.001 g |
| Base generator: 2-butanone-n-butyl carbamoyl oxime | 0.02 g |
| Solvent: propylene glycol monomethyl ether acetate | 20 g |

Figure 1:
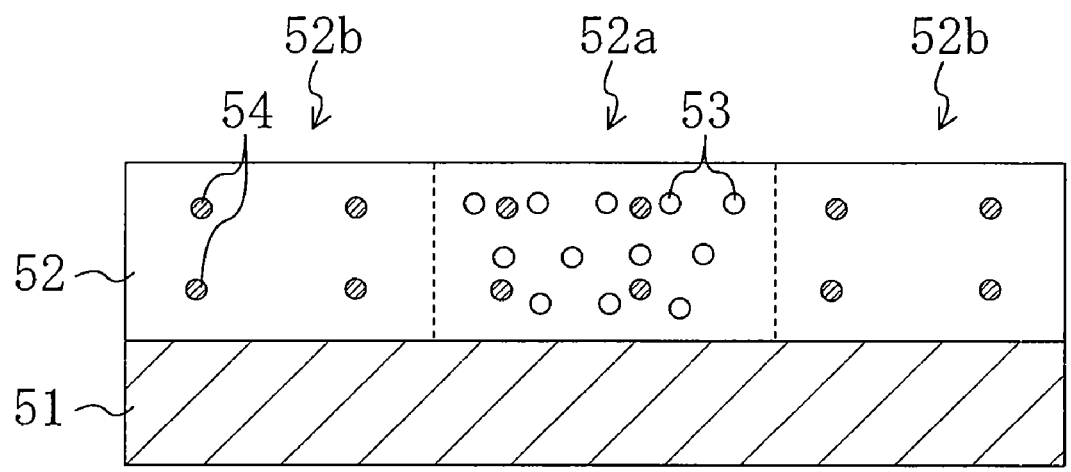
FIG. 1 is a cross-sectional view for explaining the principle of a chemically amplified resist material of this invention.
Figure 2:
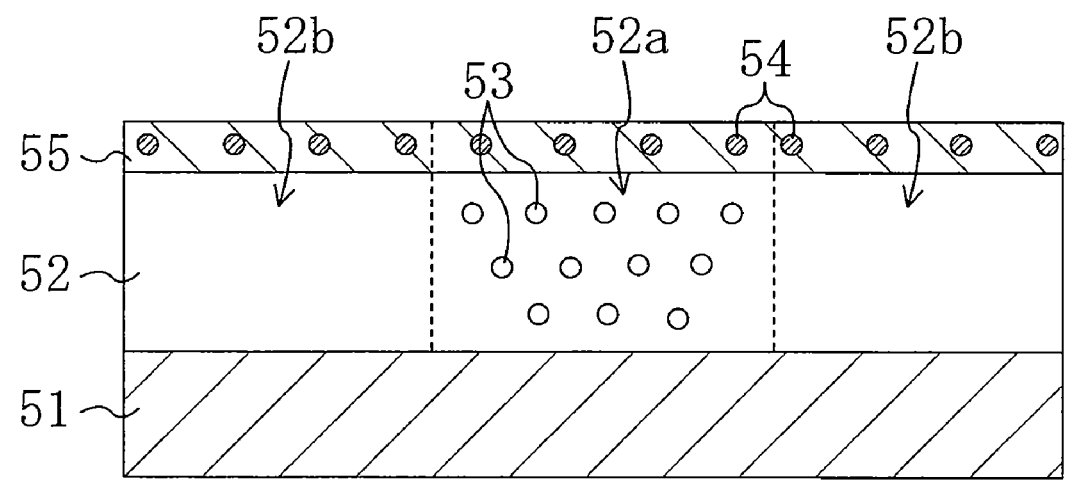
FIG. 2 is a cross-sectional view for explaining the principle of a topcoat film material of this invention.
Figure 3A:
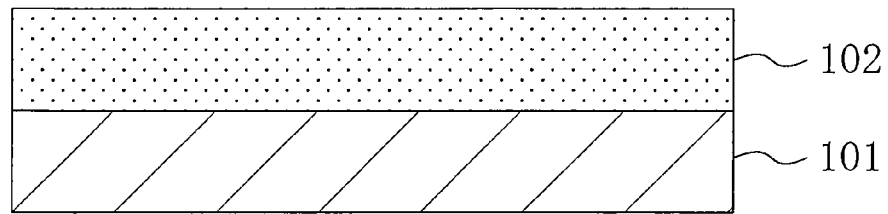
FIGS. 3A, 3B, 3C and 3D are cross-sectional views for showing procedures in a pattern formation method according to Embodiment 1 of the invention.

Next, as shown in FIG. 3A, the aforementioned chemically amplified resist material is applied on a substrate 101 and the resultant substrate is annealed with a hot plate at a temperature of 90° C. for 60 seconds, so as to form a resist film 102 with a thickness of 0.35 μm.

Figure 3B:
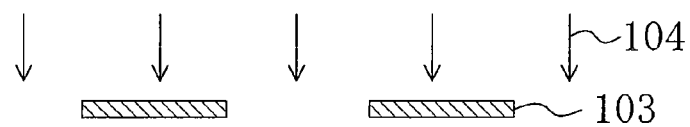
Figure 3B:
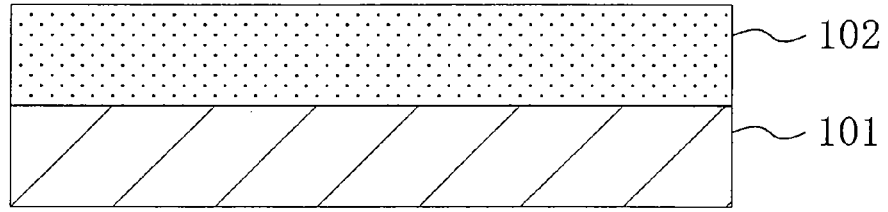

Then, as shown in FIG. 3B, pattern exposure is carried out by irradiating the resist film 102 with exposing light 104 of ArF excimer laser with NA (numerical aperture) of 0.85 through a mask 103.

Figure 3C:
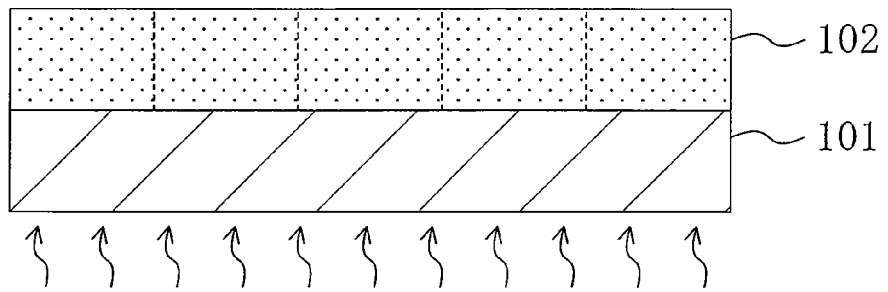

After the pattern exposure, as shown in FIG. 3C, the resist film 102 is baked with a hot plate at a temperature of 110° C. for 60 seconds (post exposure bake).

Figure 3D:
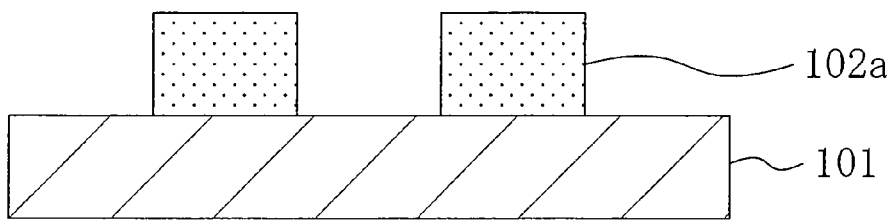

Thereafter, the resultant resist film 102 is developed with a 0.26 N tetramethylammonium hydroxide developer. Thus, a resist pattern 102a made of an unexposed portion of the resist film 102 and having a line width of 0.065 μm is formed in a good shape as shown in FIG. 3D.

In this manner, since the chemically amplified resist material of Embodiment 1 includes 2-butanone-n-butyl carbamoyl oxime as the base generator for generating a base through annealing, diffusion of an acid into an unexposed portion of the resist film in particular can be suppressed by the base (amine) generated from the carbamoyl oxime. Therefore, optical contrast is improved, so that the resist pattern 102a can be formed with high resolution in a good shape.

EMBODIMENT 2

A pattern formation method using a chemically amplified resist material according to Embodiment 2 of the invention will now be described with reference to FIGS. 4A through 4D.

First, a positive chemically amplified resist material having the following composition is prepared:

| | |
|---|---|
| Base polymer: poly((2-methyl-2-adamantyl methacrylate) (50 mol %) - (γ-butyrolactone methacrylate) (40 mol %) - (2-hydroxyadamantyl methacrylate) (10 mol %)) | 2 g |
| Photo-acid generator: triphenylsulfonium triafluoromethane sulfonate | 0.06 g |
| Quencher: triethanolamine | 0.001 g |
| Base generator: 2-butanone-2-(methacryloyloxy)-ethyl carbamoyl oxime | 0.01 g |
| Solvent: propylene glycol monomethyl ether acetate | 20 g |

Figure 4A:
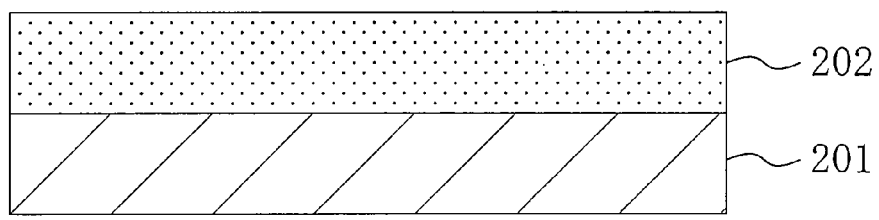
FIGS. 4A, 4B, 4C and 4D are cross-sectional views for showing procedures in a pattern formation method according to Embodiment 2 of the invention.

Next, as shown in FIG. 4A, the aforementioned chemically amplified resist material is applied on a substrate 201 and the resultant substrate is annealed with a hot plate at a temperature of 90° C. for 60 seconds, so as to form a resist film 202 with a thickness of 0.35 µm.

Figure 4B:
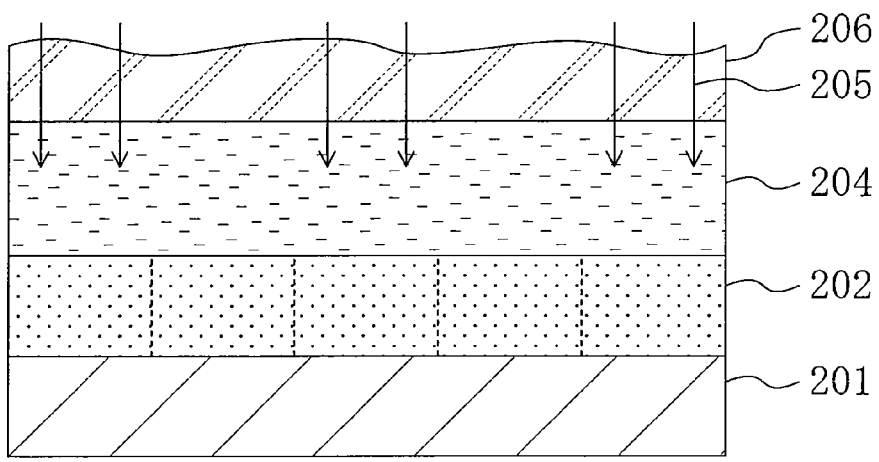

Then, as shown in FIG. 4B, with an immersion liquid 204 of water provided between the resist film 202 and a projection lens 206 by, for example, a puddle method, pattern exposure is carried out by irradiating the resist film 202 with exposing light 205 of ArF excimer laser with NA of 0.85 having passed through a mask (not shown).

Figure 4C:
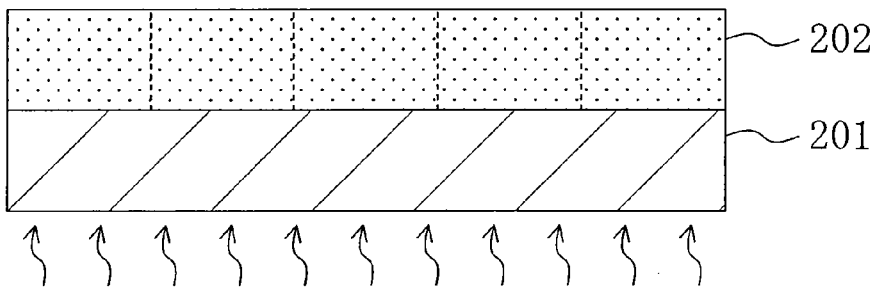

After the pattern exposure, as shown in FIG. 4C, the resist film 202 is baked with a hot plate at a temperature of 115° C. for 60 seconds (post exposure bake).

Figure 4D:
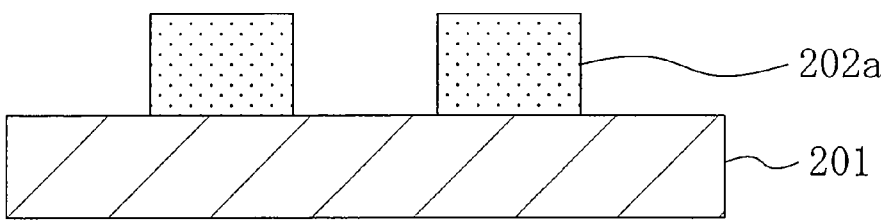

Thereafter, the resultant resist film 202 is developed with a 0.26 N tetramethylammonium hydroxide developer. Thus, a resist pattern 202a made of an unexposed portion of the resist film 202 and having a line width of 0.065 µm is formed in a good shape as shown in FIG. 4D.

In this manner, since the chemically amplified resist material of Embodiment 2 used in the immersion lithography includes 2-butanone-2-(methacryloyloxy)-ethyl carbamoyl oxime as the base generator for generating a base through annealing, diffusion of an acid into an unexposed portion of the resist film 202 in particular can be suppressed by the base (amine) generated from the carbamoyl oxime. Therefore, optical contrast is improved, so that the resist pattern 202a can be formed with high resolution in a good shape.

EMBODIMENT 3

A pattern formation method using a chemically amplified resist material according to Embodiment 3 of the invention will now be described with reference to FIGS. 5A through 5D and 6.

First, a positive chemically amplified resist material having the following composition is prepared:

| | |
|---|---|
| Base polymer: poly((2-methyl-2-adamantyl methacrylate) (50 mol %) - (γ-butyrolactone methacrylate) (40 mol %) - (2-hydroxyadamantyl methacrylate) (10 mol %)) | 2 g |
| Photo-acid generator: triphenylsulfonium nonafluorobutane sulfonate | 0.06 g |
| Quencher: triethanolamine | 0.001 g |
| Solvent: propylene glycol monomethyl ether acetate | 20 g |

Figure 5A:
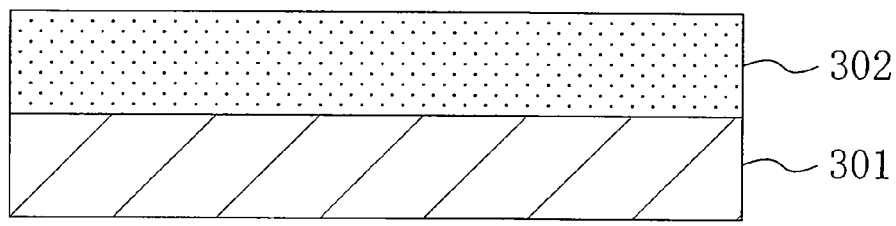
FIGS. 5A, 5B, 5C and 5D are cross-sectional views for showing procedures in a pattern formation method according to Embodiment 3 of the invention.

Next, as shown in FIG. 5A, the aforementioned chemically amplified resist material is applied on a substrate 301 and the resultant substrate is annealed with a hot plate at a temperature of 90° C. for 60 seconds, so as to form a resist film 302 with a thickness of 0.35 µm.

Figure 5B:
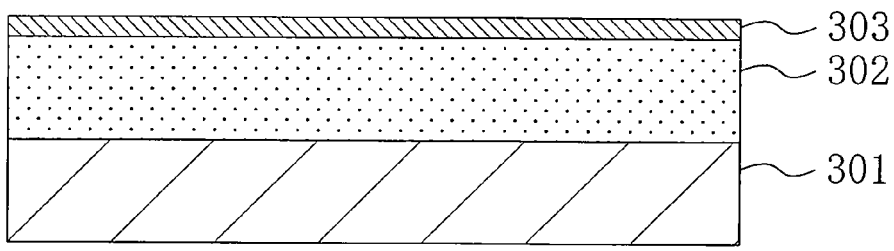

Next, as shown in FIG. 5B, a topcoat film material having the following composition is applied on the resist film 302 by, for example, spin coating and the resultant substrate is annealed with a hot plate at a temperature of 85° C. for 60 seconds, so as to form a topcoat film 303 with a thickness of 0.1 µm:

| | |
|---|---|
| Alkali-soluble polymer: polynorbornene methyl hexafluoroisopropyl alcohol | 1 g |
| Base generator: 2-propanone-n-butyl carbamoyl oxime | 0.02 g |
| Solvent: n-butyl alcohol | 20 g |

Figure 5C:
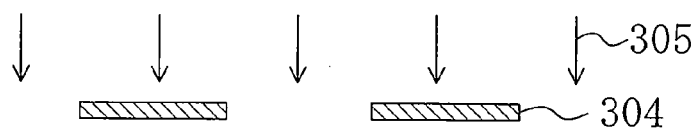
Figure 5C:
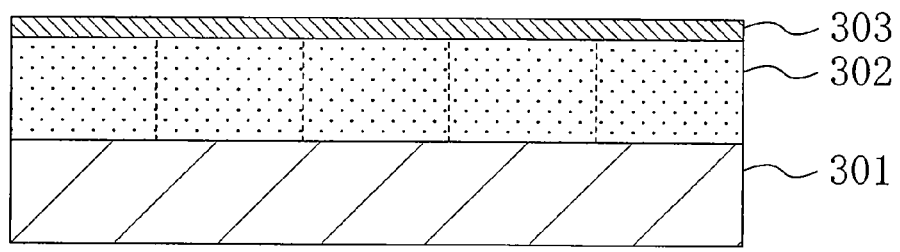

Then, as shown in FIG. 5C, pattern exposure is carried out by irradiating the resist film 302 through the topcoat film 303 with exposing light 305 of ArF excimer laser with NA of 0.85 having passed through a mask 304.

Figure 5D:
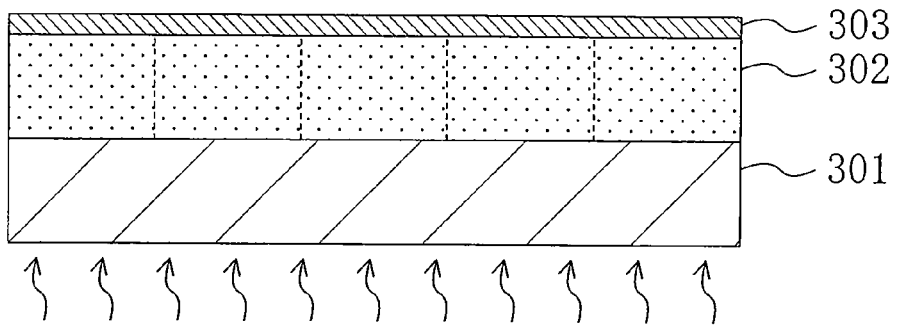

After the pattern exposure, as shown in FIG. 5D, the resist film 302 and the topcoat film 303 are baked with a hot plate at a temperature of 110° C. for 60 seconds (post exposure bake).

Figure 6:
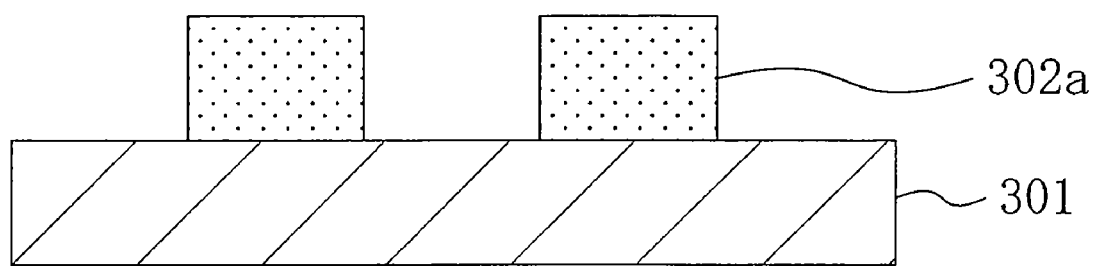
FIG. 6 is a cross-sectional view for showing another procedure in the pattern formation method of Embodiment 3 of the invention.

Thereafter, the resultant resist film 302 is developed with a 0.26 N tetramethylammonium hydroxide developer. Thus, a resist pattern 302a made of an unexposed portion of the resist film 302 and having a line width of 0.065 µm is formed in a good shape as shown in FIG. 6. At this point, the topcoat film 303 is easily removed with the alkaline developer because it includes the alkali-soluble polymer.

In this manner, since the topcoat film 303 formed on the resist film 302 in Embodiment 3 includes 2-propanone-n-butyl carbamoyl oxime as the base generator for generating a base through annealing, diffusion of an acid into an upper portion of an unexposed portion of the resist film 302 in particular can be suppressed by the base (amine) generated from the carbamoyl oxime. Therefore, optical contrast is improved, so that the resist pattern 302a can be formed with high resolution in a good shape.

EMBODIMENT 4

A pattern formation method using a chemically amplified resist material according to Embodiment 4 of the invention will now be described with reference to FIGS. 7A through 7D and 8.

First, a positive chemically amplified resist material having the following composition is prepared:

| | |
|---|---|
| Base polymer: poly((2-methyl-2-adamantyl methacrylate) (50 mol %) - (γ-butyrolactone methacrylate) (40 mol %) - (2-hydroxyadamantyl methacrylate) (10 mol %)) | 2 g |
| Photo-acid generator: triphenylsulfonium nonafluorobutane sulfonate | 0.06 g |
| Quencher: triethanolamine | 0.001 g |
| Solvent: propylene glycol monomethyl ether acetate | 20 g |

Figure 7A:
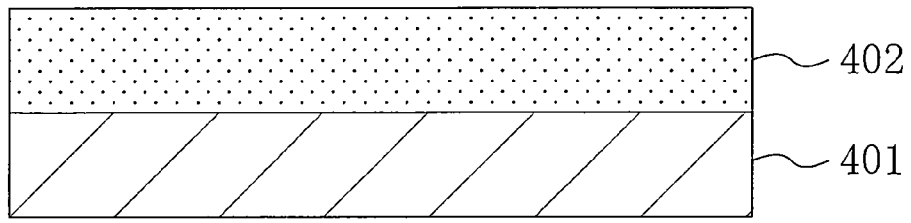
FIGS. 7A, 7B, 7C and 7D are cross-sectional views for showing procedures in a pattern formation method according to Embodiment 4 of the invention.

Next, as shown in FIG. 7A, the aforementioned chemically amplified resist material is applied on a substrate 401 and the resultant substrate is annealed with a hot plate at a temperature of 90° C. for 60 seconds, so as to form a resist film 402 with a thickness of 0.35 µm.

Figure 7B:
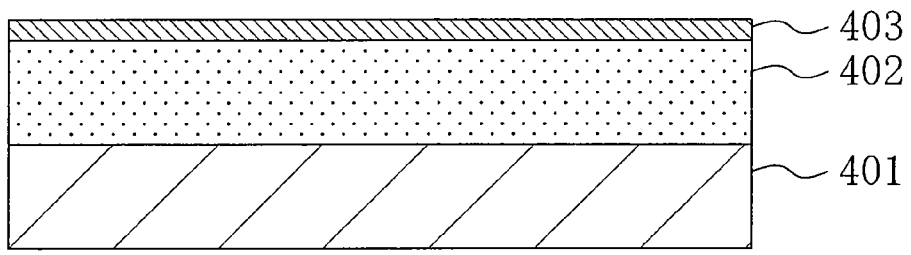

Next, as shown in FIG. 7B, a topcoat film material having the following composition is applied on the resist film 402 by, for example, the spin coating and the resultant substrate is annealed with a hot plate at a temperature of 85° C. for 60 seconds, so as to form a topcoat film 403 with a thickness of 0.1 μm:

| | |
|---|---|
| Alkali-soluble polymer: polynorbornene methyl hexafluoroisopropyl alcohol | 1 g |
| Base generator: 2-butanone-n-butyl carbamoyl oxime | 0.015 g |
| Solvent: isobutyl alcohol | 20 g |

Figure 7C:
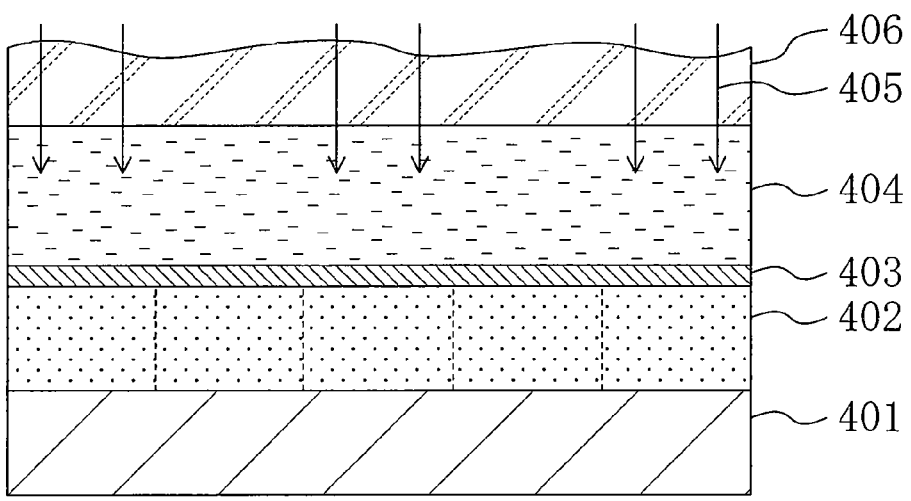

Then, as shown in FIG. 7C, with an immersion liquid 404 of water provided between the topcoat film 403 and a projection lens 406 by, for example, the puddle method, pattern exposure is carried out by irradiating the resist film 402 through the topcoat film 403 with exposing light 405 of ArF excimer laser with NA of 0.85 having passed through a mask (not shown).

Figure 7D:
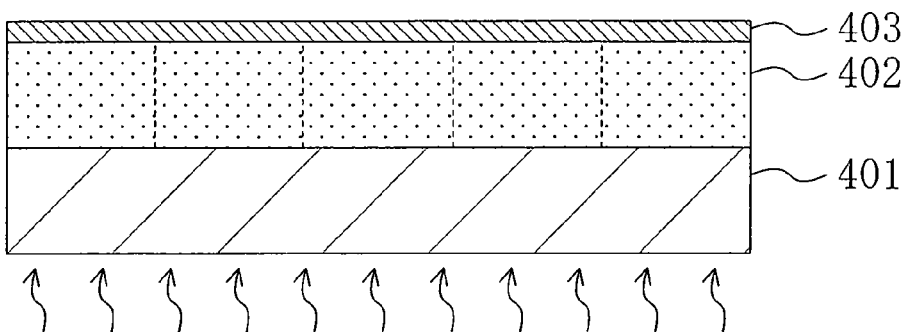

After the pattern exposure, as shown in FIG. 7D, the resist film 402 and the topcoat film 403 are baked with a hot plate at a temperature of 110° C. for 60 seconds (post exposure bake).

Figure 8:
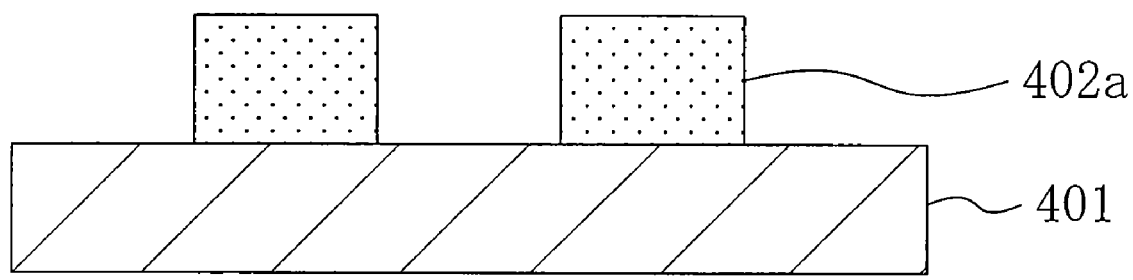
FIG. 8 is a cross-sectional view for showing another procedure in the pattern formation method of Embodiment 4 of the invention.
Figure 9A:
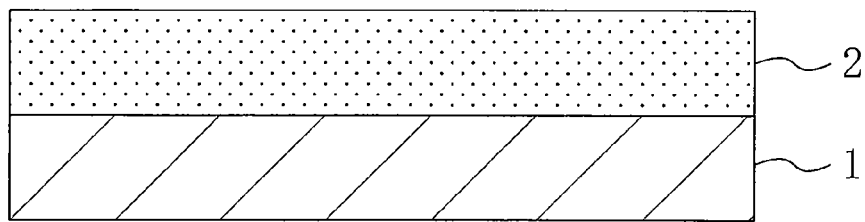
FIGS. 9A, 9B, 9C and 9D are cross-sectional views for showing procedures in a conventional pattern formation method.
Figure 9B:
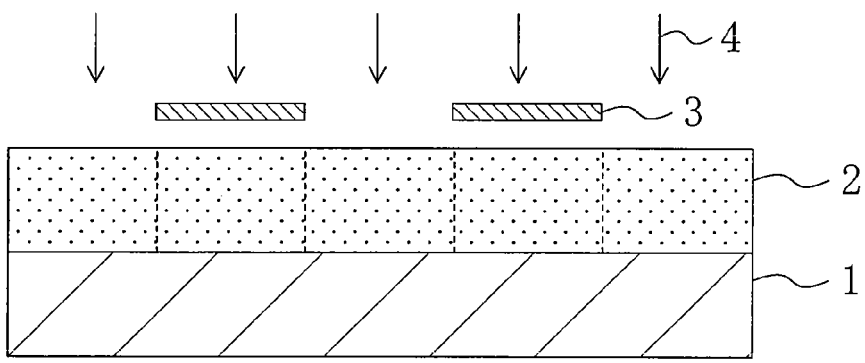
Figure 9C:
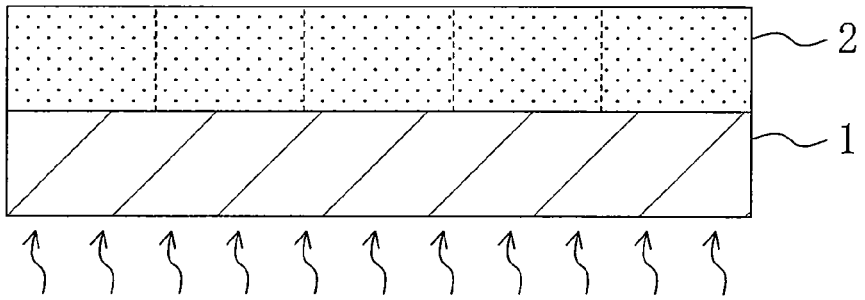
Figure 9D:
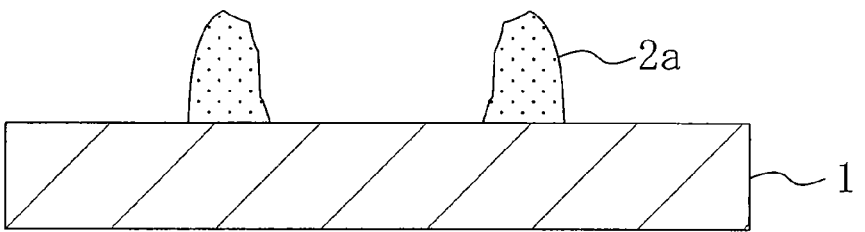

Thereafter, the resultant resist film 402 is developed with a 0.26 N tetramethylammonium hydroxide developer. Thus, a resist pattern 402a made of an unexposed portion of the resist film 402 and having a line width of 0.065 μm is formed in a good shape as shown in FIG. 8. At this point, the topcoat film 403 is easily removed with the alkaline developer because it includes the alkali-soluble polymer.

In this manner, since the topcoat film 403 formed on the resist film 402 in Embodiment 4 employing the immersion lithography includes 2-butanone-n-buyl carbamoyl oxime as the base generator for generating a base through annealing, diffusion of an acid into an upper portion of an unexposed portion of the resist film 402 in particular can be suppressed by the base (amine) generated from the carbamoyl oxime. Therefore, optical contrast is improved, so that the resist pattern 402a can be formed with high resolution in a good shape.

It is noted that the chemically amplified resist materials used in Embodiments 1 through 4 and the topcoat film materials used in Embodiments 1 and 2 are merely described as examples and the invention is not limited to these embodiments.

In particular, the base generator included in the chemically amplified resist material of Embodiment 1 is not limited to the 2-butanone-n-butyl carbamoyl oxime, the base generator included in the chemically amplified resist material of Embodiment 2 is not limited to the 2-butanone-2-(methacryloyloxy)-ethyl carbamoyl oxime, the base generator included in the topcoat film material of Embodiment 3 is not limited to the 2-propanone-n-butyl carbamoyl oxime, and the base generator included in the topcoat film material of Embodiment 4 is not limited to the 2-butanone-n-butyl carbamoyl oxime. Apart from them, examples of the acid generator including carbamoyl oxime are 2-butanone-2-(methacryloyloxy)-methyl carbamoyl oxime, 2-butanone-2-(acryloyloxy)-ethyl carbamoyl oxime, 2-butanone-2-(acryloyloxy)-methyl carbamoyl oxime, 2-butanone-isobutyl carbamoyl oxime, 2-butanone-n-propyl carbamoyl oxime, 2-butanone-isopropyl carbamoyl oxime, 2-butanone-ethyl carbamoyl oxime, 2-butanone-methyl carbamoyl oxime, 2-propanone-2-(methacryloyloxy)-ethyl carbamoyl oxime, 2-propanone-2-(methacryloyloxy)-methyl carbamoyl oxime, 2-propanone-2-(acryloyloxy)-ethyl carbamoyl oxime, 2-propanone-2-(acryloyloxy)-methyl carbamoyl oxime, 2-propanone-isobutyl carbamoyl oxime, 2-propanone-n-propyl carbamoyl oxime, 2-propanone-isopropyl carbamoyl oxime, 2-propanone-ethyl carbamoyl oxime and 2-propanone-methyl carbamoyl oxime.

Also, examples of the photo-acid generator are, apart from triphenylsulfonium nonafluorobutane sulfonate and triphenylsulfonium trifluoromethane sulfonate, diphenyliodonium nonafluorobutane sulfonate and diphenyliodonium trifluoromethane sulfonate.

Furthermore, the alkali-soluble polymer included in the topcoat film material used in Embodiment 3 or 4 can be polyacrylic acid, polymethacrylic acid, polynorbornene methyl carboxylic acid, polynorbornene carboxylic acid, polynorbornene hexafluoroisopropyl alcohol or polyvinyl alcohol instead of the polynorbornene methyl hexafluoroisopropyl alcohol.

Moreover, although water is used as the immersion liquid in Embodiments 2 and 4, an acidic solution such as a cesium sulfate ($Cs_2SO_4$) aqueous solution or a phosphoric acid ($H_3PO_4$) aqueous solution can be used instead. In this case, the preferable concentration of the acidic solution is not less than 10 wt % and not more than 60 wt %.

Although the exposing light is ArF excimer laser in Embodiments 1 through 4, KrF excimer laser, $Xe_2$ laser, $F_2$ laser, KrAr laser or $Ar_2$ laser may be used instead.

Alternatively, in the general dry exposure and not in the immersion exposure, the exposing light may be extreme UV (EUV) or electron beams (EB).

As described so far, according to the chemically amplified resist material, the topcoat film material and the pattern formation method using them of this invention, a resist pattern with high resolution can be formed in a good shape, and the invention is useful for forming a fine pattern in fabrication process or the like for semiconductor devices.

What is claimed is:

1. A pattern formation method comprising the steps of:
   forming, on a substrate, a resist film made of a chemically amplified resist material including a polymer, a photo-acid generator and carbamoyl oxime;
   performing pattern exposure by selectively irradiating the resist film with exposing light;
   baking the resist film after the pattern exposure; and
   forming a resist pattern made of the resist film by developing the resist film after baking,
   wherein the pattern exposure is performed with a liquid provided on the resist film.

2. The pattern formation method of claim 1, wherein the liquid is water or an acidic solution.

3. The pattern formation method of claim 2, wherein the acidic solution is a cesium sulfate aqueous solution or a phosphoric acid aqueous solution.

4. The pattern formation method of claim 1,
   wherein the carbamoyl oxime is 2-butanone-2-(methacryloyloxy)-ethyl carbamoyl oxime, 2-butanone-2-(methacryloyloxy)-methyl carbamoyl oxime, 2-butanone-2-(acryloyloxy)-ethyl carbamoyl oxime, 2-butanone-2-(acryloyloxy)-methyl carbamoyl oxime, 2-butanone-n-butyl carbamoyl oxime, 2-butanone-isobutyl carbamoyl oxime, 2-butanone-n-propyl carbamoyl oxime, 2-butanone-isopropyl carbamoyl oxime, 2-butanone-ethyl carbamoyl oxime, 2-butanone-methyl carbamoyl oxime, 2-propanone-2-(methacryloyloxy)-ethyl carbamoyl oxime, 2-propanone-2-(methacryloyloxy)-methyl carbamoyl oxime, 2-propanone-2-(acryloyloxy)-ethyl carbamoyl oxime, 2-propanone-2-(acryloyloxy)-methyl carbamoyl oxime, 2-propanone-n-butyl carbamoyl oxime, 2-propanone-isobutyl carbamoyl oxime, 2-propanone-n-propyl carbamoyl oxime, 2-propanone-isopropyl carbamoyl oxime, 2-propanone-ethyl carbamoyl oxime or 2-propanone-methyl carbamoyl oxime.

5. The pattern formation method of claim 1,
wherein the photo-acid generator is triphenylsulfonium nonafluorobutane sulfonate, triphenylsulfonium trifluoromethane sulfonate, diphenyliodonium nonafluorobutane sulfonate or diphenyliodonium trifluoromethane sulfonate.

6. The pattern formation method of claim 1, wherein the exposing light is ArF excimer laser.

7. The pattern formation method of claim 1, wherein the exposing light is KrF excimer laser, $Xe_2$ laser, $F_2$ laser, KrAr laser or $Ar_2$ laser.

8. The pattern formation method of claim 1, wherein the exposing light is extreme UV (EUV) or electron beams (EB).

9. A pattern formation method comprising the steps of:
forming a resist film made of a chemically amplified resist material on a substrate;
forming, on the resist film, a topcoat film including carbamoyl oxime and an alkali-soluble polymer;
performing pattern exposure by selectively irradiating the resist film with exposing light through the topcoat film;
baking the resist film and the topcoat film after the pattern exposure; and
forming a resist pattern made of the resist film by developing the resist film after baking.

10. The pattern formation method of claim 9, wherein the pattern exposure is performed with a liquid provided on the resist film.

11. The pattern formation method of claim 10, wherein the liquid is water or an acidic solution.

12. The pattern formation method of claim 11, wherein the acidic solution is a cesium sulfate aqueous solution or a phosphoric acid aqueous solution.

13. The pattern formation method of claim 9,
wherein the carbamoyl oxime is 2-butanone-2-(methacryloyloxy)-ethyl carbamoyl oxime, 2-butanone-2-(methacryloyloxy)-methyl carbamoyl oxime, 2-butanone-2-(acryloyloxy)-ethyl carbamoyl oxime, 2-butanone-2-(acryloyloxy)-methyl carbamoyl oxime, 2-butanone-n-butyl carbamoyl oxime, 2-butanone-isobutyl carbamoyl oxime, 2-butanone-n-propyl carbamoyl oxime, 2-butanone-isopropyl carbamoyl oxime, 2-butanone-ethyl carbamoyl oxime, 2-butanone-methyl carbamoyl oxime, 2-propanone-2-(methacryloyloxy)-ethyl carbamoyl oxime, 2-propanone-2-(methacryloyloxy)-methyl carbamoyl oxime, 2-propanone-2-(acryloyloxy)-ethyl carbamoyl oxime, 2-propanone-2-(acryloyloxy)-methyl carbamoyl oxime, 2-propanone-n-butyl carbamoyl oxime, 2-propanone-isobutyl carbamoyl oxime, 2-propanone-n-propyl carbamoyl oxime, 2-propanone-isopropyl carbamoyl oxime, 2-propanone-ethyl carbamoyl oxime or 2-propanone-methyl carbamoyl oxime.

14. The pattern formation method of claim 9,
wherein the alkali-soluble polymer is polyacrylic acid, polymethacrylic acid, polynorbornene methyl carboxylic acid, polynorbornene carboxylic acid, polynorbornene methyl hexafluoroisopropyl alcohol, polynorbornene hexafluoroisopropyl alcohol or polyvinyl alcohol.

15. The pattern formation method of claim 9, wherein the chemically amplified resist material includes carbamoyl oxime.

16. The pattern formation method of claim 9, wherein the exposing light is ArF excimer laser.

17. pattern formation method of claim 9, wherein the exposing light is KrF excimer laser, $Xe_2$ laser, $F_2$ laser, KrAr laser or $Ar_2$ laser.

18. The pattern formation method of claim 9, wherein the exposing light is extreme UV (EUV) or electron beams (EB).

* * * * *